United States Patent [19]

Okada et al.

[11] Patent Number: 4,825,018

[45] Date of Patent: Apr. 25, 1989

[54] VOLTAGE DETECTION CIRCUIT

[75] Inventors: Yasuyuki Okada, Takatsuki; Makoto Kojima, Suita; Hirozumi Misaki, Takatsuki, all of Japan

[73] Assignee: Matsushita Electric Industrial Co., Ltd., Kadoma, Japan

[21] Appl. No.: 197,450

[22] Filed: May 20, 1988

[30] Foreign Application Priority Data

May 20, 1987 [JP] Japan ................................ 61-122932

[51] Int. Cl.$^4$ ............................................. G05F 1/565
[52] U.S. Cl. .................... 323/351; 323/284; 307/358; 307/362
[58] Field of Search ............... 323/282, 284, 311, 312, 323/313, 314, 315, 316, 317, 349, 351; 307/358, 362, 363, 464

[56] References Cited

U.S. PATENT DOCUMENTS

| | | | |
|---|---|---|---|
| 4,663,584 | 5/1987 | Okada et al. | 323/313 |
| 4,706,011 | 11/1987 | Vergara et al. | 323/284 |
| 4,713,600 | 12/1987 | Tsugaru et al. | 323/351 |

Primary Examiner—Peter S. Wong
Attorney, Agent, or Firm—Wenderoth, Lind & Ponack

[57] ABSTRACT

In a voltage detection circuit, at least a portion of the gate insulation film of a voltage detecting transistor is formed thicker than the other portion of the gate insulation film. Such voltage detecting transistor can be fabricated on a semiconductor substrate in the same process as conventional MOS transistors, so that the extra mask or process is not required. And since the amount of trapped electron does not change due to the passing of time, aging effects for detection precision is small.

7 Claims, 5 Drawing Sheets

VOLTAGE DETECTION CIRCUIT

BACKGROUND OF THE INVENTION

This invention relates to a voltage detection circuit for detecting a voltage boosted by an integrated high voltage generating system or the like.

As electronic appliances are becoming smaller in size recently, it becomes necessary to make the power supply voltage lower. However, in certain circuits incorporated into appliances, an operating voltage higher than the power supply voltage may be needed. In such a case, usually, an integrated high voltage generating system such as a charge pump is fabricated in a semiconductor integrated circuit, and the power voltage is boosted to a necessary operating voltage by this system. It is necessary, at this time, to detect the boosted voltage and to maintain the operating voltage within a predetermined range by the detection output.

For such purpose, conventionally, the boosted voltage has been detected by using a zener diode or a P-N junction of transistor.

When using a zener diode, however, since the zener diode must be formed in a semiconductor substrate, an extra mask and an extra inplanting process are needed. Therefore, the manufacturing process becomes complicated. Moreover, when the detection voltage is higher than about 5 V, the influence of the variation of the temperature become serious.

On the other hand, in case of using a P-N junction of transistor, since the breakdown voltage of P-N junction is used for detection, it is likely to cause the so-called "snake" phenomenon, that is, the electrons are trapped in the periphery of the P-N junction due to aging effect, and the voltage becomes higher than designed voltage as time passes. Therefore, it becomes difficult to detect the voltage accurately.

SUMMARY OF THE INVENTION

It is hence a first object of this invention to present a voltage detection circuit capable of forming a voltage detecting part thereof in the same process as the manufacturing process of conventional MOS transistors, without using extra mask and extra inplanting process.

It is a second object of this invention to present a voltage detection circuit capable of detecting relatively high voltages precisely.

It is a third object of this invention to present a voltage detection circuit which is free from deterioration of detecting precision due to the passing of the time.

It is a fourth object of this invention to present a voltage detection circuit which can minimize the temperature dependence and power supply voltage dependence.

In order to achieve the above objects, this invention presents a voltage detection circuit having a voltage detecting transistor in which at least a portion of the gate insulation film is thicker than the other portion of the gate insulation film. Such voltage detecting transistor can be formed on a semiconductor substrate in the same process as conventional MOS transistors, so that extra mask or process is not needed. Therefore, the manufacturing process becomes quite simple. As to aging effects, since the amount of trapped electron does not change due to the passing of the time, and it is almost the same as that of conventional MOS transistors. Therefore, unlike the conventional method making use of the breakdown voltage of P-N junction, the detection precision does not deteriorate.

Other features and objects of the present invention will be apparent from the following description in connection with the accompanying drawings.

DETAILED DESCRIPTION OF THE INVENTION

Figure 1:
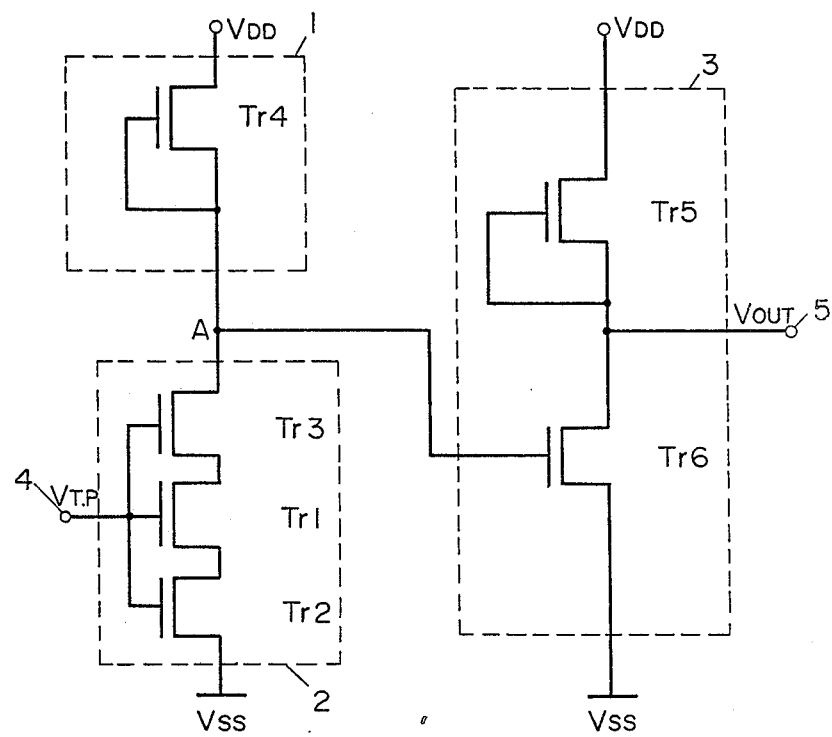
FIG. 1 is a circuit diagram of one embodiment of a voltage detection circuit of this invention.
Figure 2:
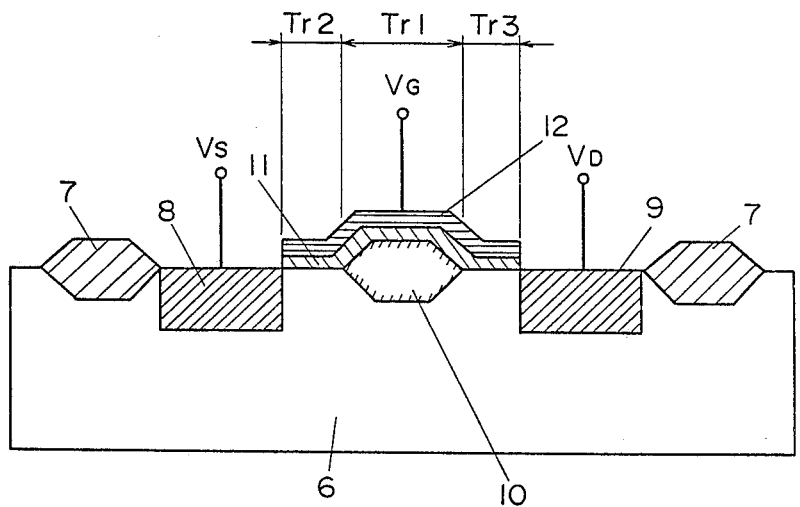
FIG. 2 is a cross sectional view of a voltage detecting transistor used in the same embodiment.

FIG. 1 and FIG. 2 show a first embodiment of the voltage detection circuit of this invention.

In FIG. 1, between constant voltage power supply $V_{DD}$ and reference potential $V_{SS}$, a load 1 composed of MOS transistor Tr4 and a voltage detecting part 2 composed of a voltage detecting transistor made of MOS transistors Tr1 to Tr3 are connected in series. Also between the constant voltage power supply $V_{DD}$ and reference potential $V_{SS}$, there is a logic gate (inverter) 3 composed of MOS transistors Tr5, Tr6. The connecting point A of load 1 and voltage detecting part 2 is connected to the gate of the transistor Tr6. An input terminal 4 is connected to the gate of the voltage detecting transistors Tr1 to Tr3, and an output terminal 5 is connected to the connecting point of the transistors Tr5 and Tr6.

In FIG. 1, meanwhile, the transistors Tr4, Tr5 are N-channel depression type transistors, and the transistor Tr6 is a N-channel enhancement type transistor.

FIG. 2 shows a practical example of composition of a voltage detecting transistor, in which a field oxide film 7 is formed on the surface of a p-type semiconductor substrate 6. On the surface of the semiconductor substrate 6, n-type diffusion layers 8, 9 are formed, which are source and drain regions respectively. A gate insulation thick film 10 composed by depositing silicon oxide in a thickness of about 6000 Å is formed in the center between the n-type diffusion layers 8 and 9. This gate insulation thick film 10 is formed simultaneously by using the same mask in the process of forming the field oxide film 7. A gate insulation thin film 11 composed by depositing silicon oxide in a thickness of about 500 Å is formed on the surface of the semiconductor substrate 6 and the gate insulation thick film 10 between n-type diffusion layers 8 and 9. A gate 12 is formed on the gate insulation thin film 11. $V_G$, $V_S$, $V_D$ denote gate electrode, source electrode, and drain electrode, respectively.

When thus composed, the voltage detecting transistor has substantially three transistors Tr1 to Tr3, and there is no diffusion layer between transistors Tr1 and Tr2, and between transistors Tr2 and Tr3, and diffusion layers 8, 9 of source and drain are formed at both sides of a single gate 12, so that these transistors Tr1 and Tr3 are equivalent to the structure of series connection as shown in FIG. 1.

In this constitution, if the voltage applied to the input terminal 1 is lower than the predetermined detection voltage $V_{TP}$, the voltage detecting transistors Tr1, Tr2, Tr3 are turned off, and the connecting point A becomes high potential. As a result, the transistor Tr6 is turned on, and output voltage VOUT of the output terminal 5 becomes low.

On the other hand, when the input voltage becomes high and reaches the predetermined detection voltage $V_{TP}$, the detecting transistors Tr1, Tr2, Tr3 are turned on, and the potential at the connecting point A becomes low. As a result, the transistor Tr6 is turned off, and the output voltage VOUT of the output terminal 5 becomes high.

Therefore, when the power supply to the integrated high voltage generating system (not shown) such as a charge pump is intermittently controlled depending on the high or low level of the output voltage VOUT, it is possible to maintain the output voltage (boosted voltage) of the integrated high voltage generating system within a predetermined range.

What is more, as in this embodiment, when the voltage detecting part 2 is composed by voltage detecting transistor in which at least a portion of the gate insulation film is formed thick, the voltage detecting transistor can be fabricated simultaneously in the manufacturing process of the field oxide film 7 and other MOS transistors. Therefore, the manufacturing process is not complicated. Besides, the voltage detecting transistor is the same as a conventional MOS transistor except for the gate insulation thick film 10. Accordingly, the amount of trapped electron is not changed due to the passing of the time, and therefore, deterioration of detecting precision due to aging effects will not occur.

Figure 3:
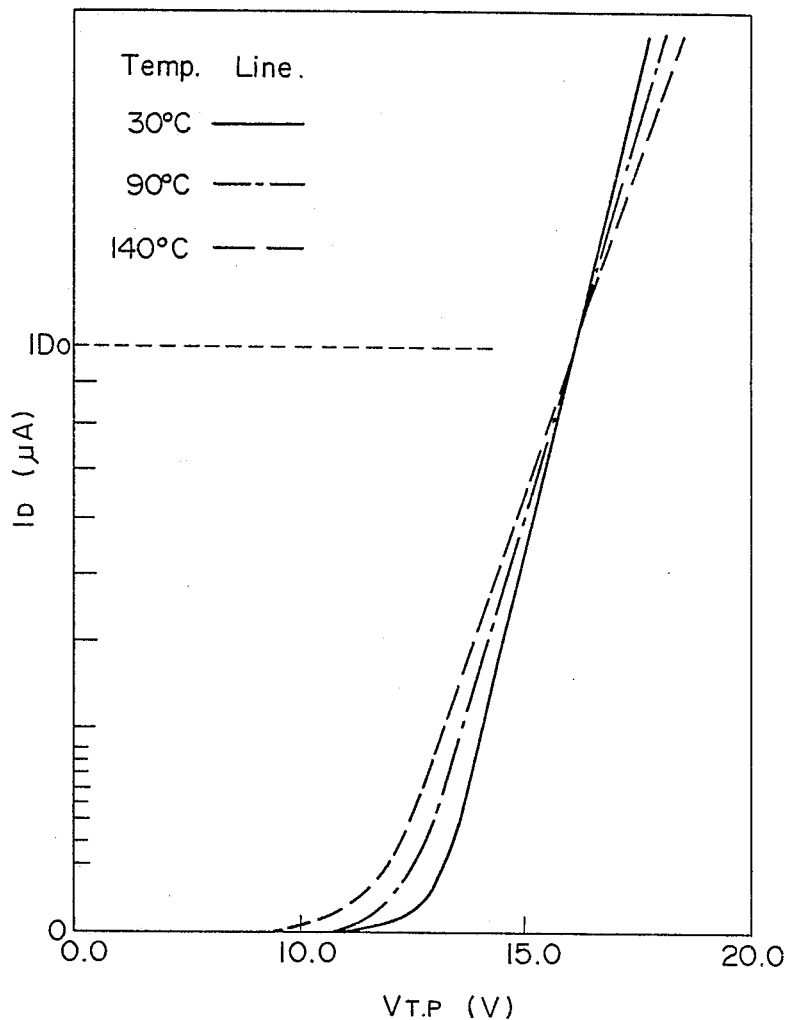
FIG. 3 is a diagram showing the temperature dependence of said voltage detecting transistor.

Incidentally, such voltage detecting transistor has a temperature dependence, and the predetermined detection voltage may fluctuate depending on the temperature variations. The inventors, accordingly, measured to see how the input voltage-current characteristic of the voltage detecting part 2 in FIG. 1 would change due to the temperature variations. The results are shown in FIG. 3. In the diagram, the axis of abscissas denotes the predetermined detection voltage $V_{TP}$, and the axis of ordinances denotes the square root $\sqrt{I_D}$ of the current $I_D$ running in form the load 1. As obvious from FIG. 3, as the temperature changes to 30° C., 90° C., 140° C., the input voltage-current characteristic of the voltage detecting part 2 varies. However three curves join at one point. In other words, there is a point where the influence of the temperature variation is the minimum at $I_D = I_{D0}$. This point is almost constant even if the threshold voltage of the voltage detecting transistor varies. Therefore, when it is designed to supply a current of $I_{D0}$ to the voltage detecting part 2 from the load 1 in FIG. 1, the temperature dependence becomes minimum, so that the detecting precision becomes so much higher.

The power supply voltage dependence of the voltage detecting transistor is rather smaller as compared with that of a conventional MOS transistor. Influence of the fluctuations of power supply voltage on the voltage detecting part 2 are due to the variation of the current flowing into the voltage detecting part 2 owing to the power supply voltage dependence of the current flowing in the load 1.

Figure 4:
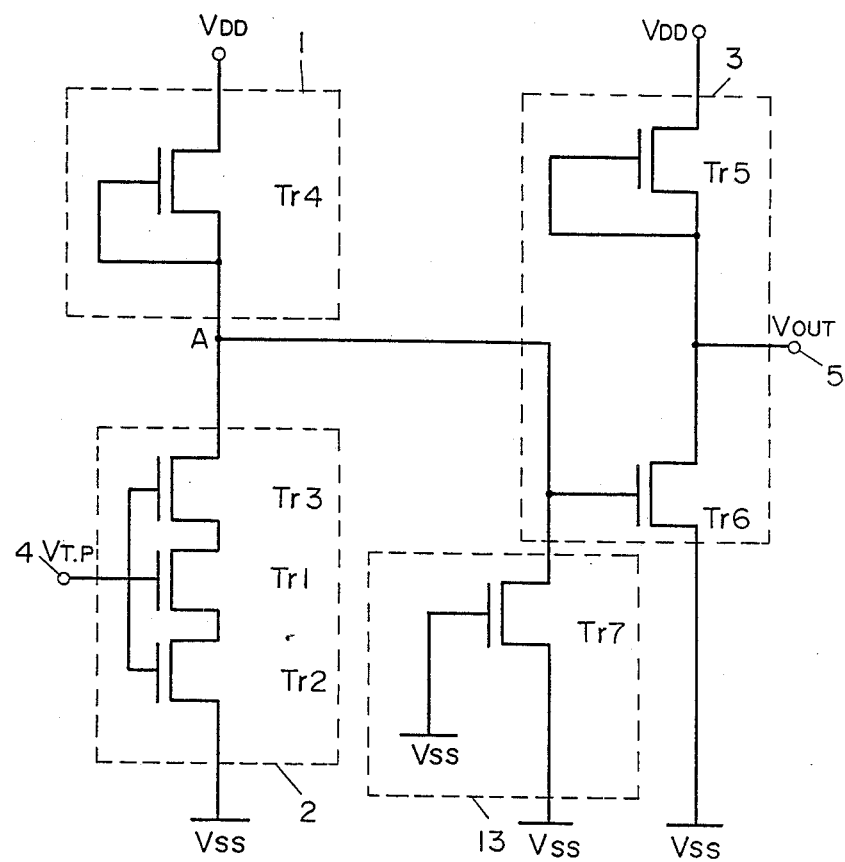
FIG. 4 is a circuit diagram of other embodiment of this invention.

To lessen the influence of such power supply voltage fluctuations, it is useful to connect a second load 13 composed of n-channel depression type MOS transistor Tr7 parallel to the detecting transistor as shown in FIG. 4 and to leak the current excessively supplied to the voltage detecting part 2 through the second load 13.

Figure 5:
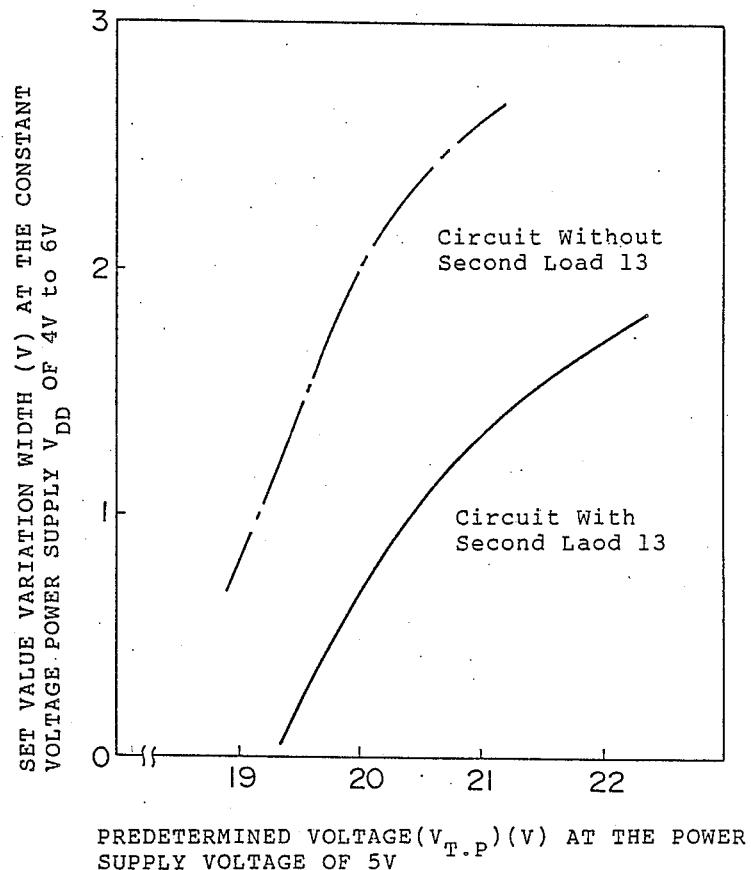
FIG. 5 is a diagram comparing the power supply voltage dependence between the presence and absence of a second load.

FIG. 5 shows the result of simulation of the power supply voltage dependence compared between the presence and absence of the second load 13, in which the axis of abscissas denotes the predetermined voltage (V) at the power supply voltage of 5 V, and the axis of ordinates denotes the set value variation width (V) at the constant voltage power supply $V_{DD}$ of 4 V to 6 V. As obvious from FIG. 5, regardless of the second load 13 (Tr7), the power supply voltage dependence tends to increase as the predetermined detection voltage $V_{TP}$ becomes higher, but when the second load 13 is provided, as compared with the case without it, the power supply voltage dependence is improved in a wide range of the predetermined detection voltage.

Thus, according to this invention, since the voltage is detected by a voltage detecting transistor in which at least a portion fo the gate insulation film is formed thick, fabrication is easy, aging effect is smaller, and therefore, the detecting precision may be maintained.

What is claimed is:

1. A voltage detection circuit comprising:
   a serially connected voltage detecting transistor and a load between a constant voltage power supply terminal and a reference potential, in which at least a portion of gate insulation film of a gate of said voltage detecting transistor is formed thick; and
   a logic gate whose input terminal is connected to a connecting point of said voltage detection transistor and said load;
   whereby, when potential applied to said gate of said voltage detection transistor reaches a predetermined voltage, an output from said logic gate is inverted by a potential of said connecting point.

2. A voltage detection circuit according to claim 1, wherein said voltage detecting transistor comprises diffusion layers which are source and drain regions formed in a semiconductor substrate, a gate insulation thick film formed on a surface of said semiconductor substrate including at least a center portion thereof between said source and drain regions, a gate insulation thin film formed on at least said gate insulation thick film, and a gate electrode formed on said gate insulation thin film.

3. A voltage detection circuit according to claim 1, wherein a predetermined electric current is supplied from said load to said voltage detecting transistor so that a temperature dependence of said voltage detecting transistor is minimum.

4. A voltage detection circuit according to claim 1, wherein a second load is connected electrically parallel to said voltage detecting transistor.

5. A voltage detection circuit according to claim 2, wherein a predetermined electric current is supplied from said load to said voltage detecting transistor so that a temperature dependence of said voltage detecting transistor is minimum.

6. A voltage detection circuit according to claim 2, wherein a second load is connected electrically parallel to said voltage detecting transistor.

7. A voltage detection circuit according to claim 3, wherein a second load is connected electrically parallel to said voltage detecting transistor.

* * * * *